United States Patent

Miura et al.

Patent Number: 5,864,573
Date of Patent: Jan. 26, 1999

[54] EPITAXIAL WAFER AND COMPOUND SEMICONDUCTOR LIGHT EMITTING DEVICE, AND METHOD OF FABRICATING THE SAME

[75] Inventors: Yoshiki Miura; Hideki Matsubara, both of Hyogo; Hisashi Seki; Akinori Koukitu, both of Tokyo, all of Japan

[73] Assignee: Sumitomo Electric Industries, Ltd., Osaka, Japan

[21] Appl. No.: 636,563

[22] Filed: Apr. 23, 1996

[30] Foreign Application Priority Data

Apr. 25, 1995 [JP] Japan .................................. 7-101351

[51] Int. Cl.$^6$ ............................... H01S 3/19; H01L 21/20
[52] U.S. Cl. ................................. 372/45; 372/43; 372/50; 437/51; 437/129
[58] Field of Search ................................. 372/43, 45, 50; 257/15, 103, 79, 94, 95, 96, 101, 186; 437/51, 126, 127, 129, 130, 131, 133, 241

[56] References Cited

U.S. PATENT DOCUMENTS

| | | | |
|---|---|---|---|
| 5,237,182 | 8/1993 | Kitagawa et al. | 257/15 |
| 5,679,965 | 10/1997 | Schetzina | 257/103 |
| 5,714,006 | 2/1998 | Kizuki et al. | 117/89 |
| 5,727,008 | 3/1998 | Koga | 372/43 |

OTHER PUBLICATIONS

Nikkei Science, Oct., 1994, pp. 44 to 55.

Primary Examiner—Brian Healy
Attorney, Agent, or Firm—W. F. Fasse; W. G. Fasse

[57] ABSTRACT

A compound semiconductor light emitting device having a long life and high performance and a method for industrially fabricating the same are provided. The compound semiconductor light emitting device includes a GaP substrate, a buffer layer consisting of InN which is formed on the substrate, a relaxation layer consisting of $In_xGa_{1-x}N$ which is formed on the buffer layer, and a luminescent layer consisting of $In_kGa_{1-k}N$ which is formed on the relaxation layer. In this description, k represents a constant value within the range of 0<k<1, and x (excluding 1 and k) decreases from 1 to k through the relaxation layer in the direction of thickness from the side adjacent the buffer layer toward the side adjacent the luminescent layer. In fabrication of the compound semiconductor light emitting device having the aforementioned structure, a buffer layer and an epitaxial layer are formed by the same organic metal chloride vapor phase epitaxy process.

20 Claims, 3 Drawing Sheets

EPITAXIAL WAFER AND COMPOUND SEMICONDUCTOR LIGHT EMITTING DEVICE, AND METHOD OF FABRICATING THE SAME

BACKGROUND OF THE INVENTION

1. Field of the Invention

The present invention relates to an epitaxial wafer and a compound semiconductor light emitting device, and methods of fabricating the same, and more particularly, it relates to an InGaN-based epitaxial wafer and compound semiconductor light emitting device employing volatile compound semiconductor substrates of GaAs, GaP, InAs or InP, and methods of fabricating the same.

2. Description of the Background Art

FIG. 4 is a sectional view showing the structure of a GaN-based blue or green light emitting device (LED) employing a sapphire substrate described in Nikkei Science, October 1994, p. 44, for example, which is now being put on the market.

Referring to FIG. 4, a clad layer 14 consisting of n-type AlGaN, a luminescent layer 15 consisting of InGaN, a clad layer 16 consisting of p-type AlGaN and a GaN epitaxial layer 17 are successively formed on an epitaxial wafer which is formed by a sapphire substrate 11, a gallium nitride (GaN) buffer layer 12 which is formed on the substrate 11 and a hexagonal n-type GaN epitaxial layer 13 which is formed on the GaN buffer layer 12 in this blue or green light emitting device. Ohmic electrodes 18 and 19 are formed on the GaN epitaxial layers 13 and 17 respectively. In this blue or green light emitting device, the GaN buffer layer 12 is adapted to relax distortion caused by the difference in lattice constant between the sapphire substrate 11 and the GaN epitaxial layer 13.

Referring to FIG. 4, this blue or green light emitting device employs insulating sapphire as the material for the substrate 11, and hence two electrodes must be formed on the same surface side in order to fabricate the device. Thus, patterning through photolithography must be performed at least twice while the nitride layers must be etched by reactive ion etching, whereby complicated steps become necessary. Further, sapphire is hard to handle in element isolation, due to its high hardness. Thus, employment of the sapphire substrate is problematic in process cost. In view of application to a light emitting device, sapphire cannot be applied to a laser diode having an optical resonator which is formed by a cleavage end plane, since the same is impossible to cleave.

Further, it has been difficult to fabricate a blue or green light emitting device by a conventional growth method, since the growth temperature is so high that growth with a high In composition ratio cannot be attained in the InGaN layer 15 which is an active layer. In addition, zinc (Zn) must indispensably be introduced as an emission center, leading to such technical problems in application to a device that the emission wavelength is widened and display performance of a full-color display is deteriorated.

To this end, it has been attempted to employ a volatile compound semiconductor such as conductive GaAs as the material for the substrate in place of sapphire having the aforementioned disadvantages. When the substrate is prepared from GaAs, however, an epitaxial wafer comparable to the wafer employing a sapphire substrate cannot be obtained under similar conditions.

Thus, a number of studies have been made in order to form GaN epitaxial layers on GaAs substrates. Most of these studies are adapted to form buffer layers consisting of GaN, AlN, GaAs and the like on GaAs substrates and thereafter form GaN epitaxial layers on the buffer layers.

However, the difference in lattice constants, or lattice incommensurateness between GaAs and that GaN and that between GaAs and AlN are 20% and 23% respectively.

If an epitaxial wafer which is fabricated by forming a buffer layer consisting of GaN or AlN on a GaAs substrate and further forming a GaN epitaxial layer thereon as described above is applied to a light emitting device (LED), therefore, there is a possibility that the life of the device is disadvantageously reduced by crystal defects.

SUMMARY OF THE INVENTION

An object of the present invention is to provide a compound semiconductor light emitting device having a long life and high performance which can solve the aforementioned problems, and a method which can industrially fabricate the same.

According to an aspect of the present invention, an epitaxial wafer is provided. This epitaxial wafer comprises a volatile compound semiconductor substrate, a buffer layer consisting of InN which is formed on the substrate, and an epitaxial layer containing a material selected from a group consisting of InGaN and GaN which is formed on the buffer layer.

The material for the volatile compound semiconductor substrate is prepared from a compound semiconductor such as GaAs, GaP, InAs or InP, for example.

A compound semiconductor light emitting device according to the present invention preferably comprises a volatile compound semiconductor substrate, a buffer layer consisting of InN which is formed on the substrate, a relaxation layer consisting of $In_xGa_{1-x}N$ which is formed on the buffer layer, and a luminescent layer consisting of $In_kGa_{1-k}N$ which is formed on the relaxation layer.

In the above description, k represents a constant value within the range of $0<k<1$, and x (excluding 1 and k) decreases from 1 to k in the direction of thickness from the side adjacent the buffer layer toward the side adjacent the luminescent layer.

Further, x may monotonously or stepwisely decrease from 1 to k in the direction of thickness from the buffer layer side toward the luminescent layer side. In the monotonous case, x may linearly or curvedly decrease, for example.

When the luminescent layer consisting of $In_kGa_{1-k}N$ is not doped with an emission center such as Zn, band-end emission is obtained with a sharp emission spectrum in a luminescent color of violet in the range of $0<k<0.4$, blue in the range of $0.4\leq k<0.7$, green in the range of $0.7\leq k<0.9$, or yellow in the range of $0.9\leq k<1$.

The material for the volatile compound semiconductor substrate is prepared from a compound semiconductor such as GaAs, GaP, InAs or InP, for example.

Thus, each of the epitaxial wafer and the compound semiconductor light emitting device according to the present invention comprises a buffer layer consisting of InN.

The difference in lattice constants or lattice incommensurateness between InN and GaP is 9%. Further, the lattice incommensurateness between InN and GaAs is 12%. On the other hand, in a blue or green light emitting device which is now available on the market, a buffer layer of GaN is formed on a sapphire substrate, and the lattice incommensurateness between GaN and sapphire is 13%. Thus, it is possible to reduce the lattice incommensurateness between the substrate and the buffer layer according to the present invention. Consequently, the number of crystal defects can be reduced, and a compound semiconductor light emitting device having a long life and high performance can be simply fabricated at a low cost with employment of a GaAs, GaP, InAs or InP substrate.

According to another aspect of the present invention, a method of fabricating an epitaxial wafer is provided. This fabrication method comprises a first step of forming a buffer layer consisting of InN on a volatile compound semiconductor substrate by introducing a first gas containing an organic metal raw material containing hydrogen chloride and indium and a second gas containing ammonia into a reaction chamber, while heating the overall reaction chamber from the exterior, for vapor-depositing the same on the substrate which is set in the reaction chamber. The method further comprises a second step of forming an epitaxial layer containing InGaN on the buffer layer by introducing a first gas containing an organic metal raw material containing gallium and an organic metal raw material containing indium and a second gas containing ammonia into the reaction chamber, while heating the overall reaction chamber from the exterior, for vapor-depositing the same on the substrate which is set in the reaction chamber.

The organic metal raw material containing gallium is prepared from trimethyl gallium or triethyl gallium, for example. On the other hand, the organic metal raw material containing indium is prepared from trimethyl indium or triethyl indium, for example.

The material for the volatile compound semiconductor substrate is prepared from a compound semiconductor such as GaAs, GaP, InAs or InP, for example.

A method of fabricating a compound semiconductor light emitting device according to the present invention preferably comprises a first step of forming a buffer layer consisting of InN on a volatile compound semiconductor substrate by introducing a first gas containing an organic metal raw material containing hydrogen chloride and indium and a second gas containing ammonia into a reaction chamber, while heating the overall reaction chamber from the exterior, for vapor-depositing the same on the substrate which is set in the reaction chamber. The method further comprises a second step of forming a relaxation layer consisting of $In_xGa_{1-x}N$ on the buffer layer while increasing the temperature of the substrate by introducing a first gas containing an organic metal raw material containing gallium and an organic metal raw material containing indium and a second gas containing ammonia into the reaction chamber, while heating the overall reaction chamber from the exterior, for vapor-depositing the same on the substrate which is set in the reaction chamber. The method further preferable comprises a third step of forming a luminescent layer consisting of $In_kGa_{1-k}N$ on the relaxation layer by introducing a first gas containing an organic metal raw material containing hydrogen chloride and gallium and an organic metal raw material containing indium and a second gas containing ammonia into the reaction chamber, while heating the overall reaction chamber from the exterior, for vapor-depositing the same on the substrate which is set in the reaction chamber.

In the above description, k represents a constant value within the range of $0<k<1$, and x (excluding 1 and k) decreases from 1 to k through the relaxation layer in the direction of thickness from the side adjacent the buffer layer toward the side adjacent the luminescent layer.

The organic metal raw material containing gallium is prepared from trimethyl gallium or triethyl gallium, for example. On the other hand, the organic metal raw material containing indium is prepared from trimethyl indium or triethyl indium, for example.

The material for the volatile compound semiconductor substrate is prepared from a compound semiconductor such as GaAs, GaP, InAs or InP, for example.

Thus, each of the inventive methods of fabricating an epitaxial wafer and a compound semiconductor light emitting device use the method (hereinafter referred to as "organic metal chloride vapor phase epitaxy") of introducing a first gas containing an organic metal raw material containing hydrogen chloride and gallium and an organic metal raw material containing indium and a second gas containing ammonia into the reaction chamber, while heating the overall reaction chamber from the exterior, for vapor-depositing the same on the substrate which is set in the reaction chamber, for forming the InN buffer layer and the epitaxial layer consisting of a material selected from the group consisting of InGaN and GaN. This organic metal chloride vapor phase epitaxy process is carried out at a high growth rate, and can obtain a steep heterointerface.

According to the present invention, further, the buffer layer and the epitaxial layer are formed by the same organic metal chloride vapor phase epitaxy process. Thus, these layers can be consistently grown in the same chamber.

Thus, the methods according to the present invention are sufficiently applicable to industrial production.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

EXAMPLE 1

Figure 1:
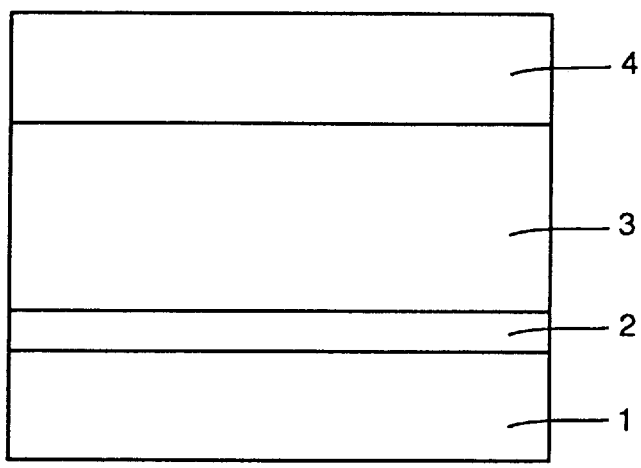
FIG. 1 is a sectional view showing the structure of an exemplary compound semiconductor light emitting device according to the present invention.

FIG. 1 is a sectional view showing the structure of an exemplary compound semiconductor light emitting device according to the present invention.

Referring to FIG. 1, this compound semiconductor light emitting device comprises a GaP substrate 1, a buffer layer 2 consisting of InN which is formed on the substrate 1, a relaxation layer 3 which is formed on the buffer layer 2, and a luminescent layer 4 consisting of $In_{0.2}Ga_{0.8}N$, doped with Zn, which is formed on the relaxation layer 3. A clad layer is formed on the luminescent layer 4, and electrodes are formed on an upper part of the clad layer and the back surface of the substrate 1 respectively.

The relaxation layer 3 consists of $In_xGa_{1-x}N$, where x linearly decreases from 1 to 0.2 in the direction of thickness from a side of the relaxation layer adjacent the buffer layer 2 toward the side of the relaxation layer adjacent the luminescent layer 4.

Figure 2:
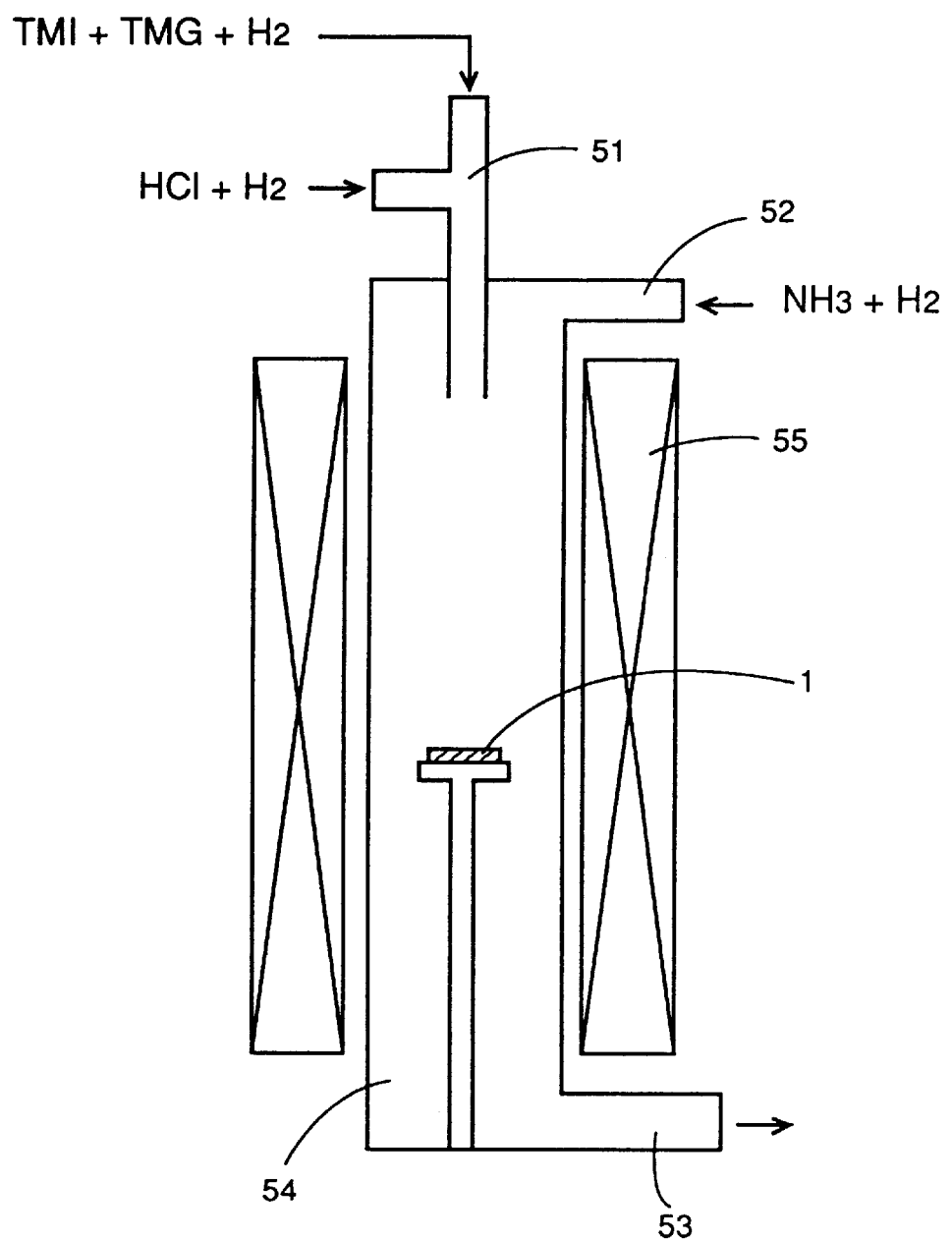
FIG. 2 schematically illustrates the structure of a vapor deposition device employed for fabricating a compound semiconductor light emitting device using organic metal chloride vapor phase epitaxy according to the present invention.
Figure 4:
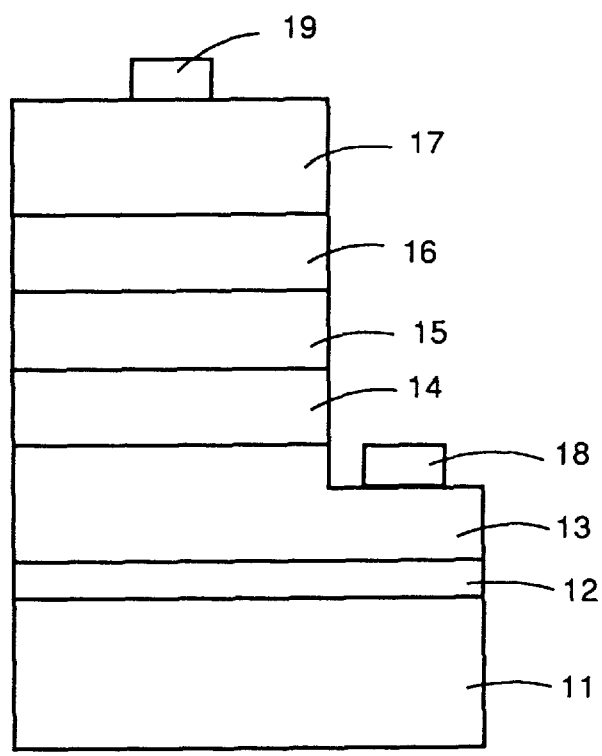
FIG. 4 is a sectional view showing the structure of an exemplary conventional blue light emitting device.

A method of fabricating the compound semiconductor light emitting device having the aforementioned structure will now be described. FIG. 2 schematically illustrates the structure of a vapor phase deposition device which is employed for fabricating a compound semiconductor light emitting device using organic metal chloride vapor phase epitaxy according to the present invention. Referring to FIG. 2, this device is formed by a reaction chamber 54 having a first gas inlet port 51, a second gas inlet port 52 and an exhaust port 53, and a resistance heater 55 for heating the overall chamber from the exterior of the reaction chamber 54.

With the device having the aforementioned structure, a compound semiconductor light emitting device was fabricated as follows. Referring to FIG. 2, a GaP substrate 1 which was pretreated with a diluted aqua regia etching solution was set in the reaction chamber 54 consisting of quartz.

Then, the overall chamber 54 was heated by the resistance heater 55 from the exterior, and trimethyl indium (TMIn) as a group III raw material and hydrogen chloride (HCl) were introduced through the first gas inlet port 51 at partial pressures of $8 \times 10^{-4}$ atm. and $8 \times 10^{-4}$ atm. respectively, and ammonia gas ($NH_3$) was introduced as a group V raw material through the second gas inlet port 52 at a partial pressure of $1.6 \times 10^{-1}$ atm., while maintaining the substrate 1 in a temperature range of 450° C. to 650° C. The raw materials were epitaxially grown under such conditions for 30 minutes, for forming a buffer layer 2 consisting of InN with a thickness of 30 nm. Due to such interposition of the buffer layer 2, it was possible to remarkably improve the crystallinity of an epitaxial layer which was formed thereon.

Then, the temperature of the substrate 1 with the buffer layer 2 consisting of InN formed thereon was increased to 500° C. to 800° C. by the resistance heater 55, the partial pressure of TMGa was linearly changed from 0 atm. to $6.4 \times 10^{-1}$ atm., and the partial pressure of TMIn was linearly changed from $8 \times 10^{-4}$ atm. to $1.6 \times 10^{-1}$ atm., while epitaxially growing the raw materials for 60 minutes. Consequently, a relaxation layer 3 consisting of $In_xGa_{1-x}N$ was formed on the buffer layer 2, where x linearly decreased from 1 to 0.2 in the direction of thickness from the side adjacent the buffer layer 2 toward the side adjacent the luminescent layer 4.

Then, the temperature of the substrate 1 with the buffer layer 2 and the relaxation layer 3 formed thereon was maintained at 800° C. by the resistance heater 55 for carrying out epitaxial growth, thereby forming the luminescent layer 4 consisting of $In_{0.2}Ga_{0.8}N$ on the relaxation layer 3.

The dopant for the relaxation layer 3 and the luminescent layer 4 consisting of InGaN was prepared from Si or S serving as an n-type material, or from Zn serving as a p-type material.

Then, a clad layer was formed on the luminescent layer 4, and thereafter electrodes were formed on this clad layer and the back surface of the substrate 1 respectively, thereby completing a blue light emitting device. It was confirmed that the blue light emitting device obtained in the aforementioned manner exhibits high performance.

When the partial pressure of TMIn was adjusted to be 20 times that of TMGa and the substrate temperature was adjusted in the range of 500° C. to 700° C., a luminescent layer 4 consisting of $In_{0.5}Ga_{0.5}N$ was formed under remaining conditions absolutely the same as those above, except that the luminescent layer was not doped. Consequently, a blue light emitting device was obtained having superior wavelength purity as compared to the aforementioned device having the luminescent layer of $In_{0.2}Ga_{0.8}N$.

When the partial pressure of TMIn was adjusted to be 50 times that of TMGa and the substrate temperature was adjusted in the range of 450° C. to 650° C., on the other hand, a luminescent layer 4 consisting of $In_{0.8}Ga_{0.2}N$ was formed under remaining conditions absolutely the same as those above, except that the $In_{0.8}Ga_{0.2}N$ was not doped. Consequently, a green light emitting device having excellent wavelength purity was obtained.

EXAMPLE 2

A compound semiconductor light emitting device was prepared similarly to Example 1, except that Mg was employed as a p-type dopant for a luminescent layer 4 consisting of InGaN. Consequently, it was possible to implement band-end emission having a sharp emission wavelength.

In a conventional blue or green light emitting device, the emission wavelength was broad since blue emission was attained by introducing a deep center of Zn as the emission center. According to the present invention, on the other hand, it is possible to form an InGaN layer having a high In composition by employing a volatile compound semiconductor substrate of GaAs, GaP, In As or InP. Consequently, band-end emission having a sharp emission wavelength can be implemented by Mg doping, thereby enabling wide-ranging application to a laser diode or the like.

Further, the number of crystal defects can be reduced due to the small degree of lattice of mismatch or incommensurateness, whereby a blue or green light emitting device having a longer life than the conventional device can be formed.

When a light emitting device absolutely similar to the above was formed on a GaAs substrate, it was possible to similarly form a blue or green light emitting device of high performance.

EXAMPLE 3

Figure 3:
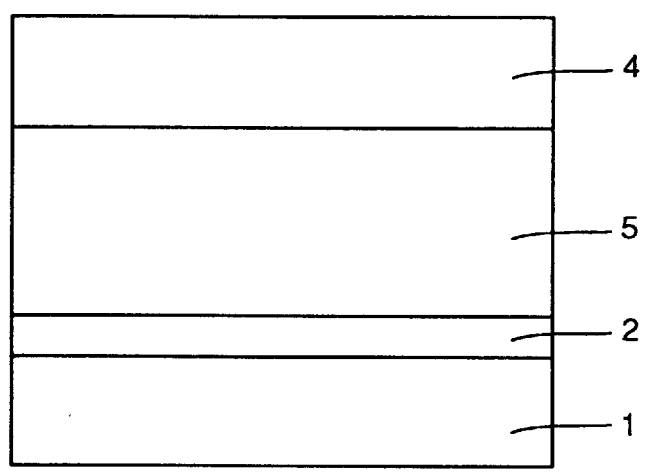
FIG. 3 is a sectional view showing the structure of another exemplary compound semiconductor light emitting device according to the present invention.

FIG. 3 is a sectional view showing another exemplary compound semiconductor light emitting device according to the present invention.

Referring to FIG. 3, this compound semiconductor light emitting device comprises a GaAs substrate 1, a buffer layer 2 consisting of InN which is formed on the substrate 1, an epitaxial layer 5 consisting of GaN which is formed on the buffer layer 2, and a luminescent layer 4 consisting of $In_{0.2}Ga_{0.8}N$, doped with Zn, which is formed on the epitaxial layer 5. A clad layer is formed on the luminescent layer 4, and electrodes are formed on an upper part of the clad layer and the back surface of the substrate 1 respectively.

A method of fabricating the compound semiconductor light emitting device having the aforementioned structure will now be described. The device shown in FIG. 2, which has been described with reference to Example 1, was employed to prepare a compound semiconductor light emitting device as follows.

Referring to FIG. 2, a substrate 1 which was pretreated with a hydrochloric acid etching solution was set in the reaction chamber 54 consisting of quartz. Then, a buffer layer 2 consisting of InN was formed with a thickness of about 30 nm on the substrate 1 by the same method as Example 1.

Then, the reaction chamber 54 was heated from the exterior by the resistance heater 55 and the temperature of the substrate 1 with the buffer layer 2 consisting of InN formed thereon was set at about 820° C., and trimethyl gallium (TMGa) as a group III raw material and hydrogen chloride (HCl) were introduced through the first gas inlet port 51 at partial pressures of $8 \times 10^{-4}$ atm. and $8 \times 10^{-4}$ atm. respectively, while ammonia gas (NH$_3$) was introduced as a group V raw material through the second gas inlet port 52 at a partial pressure of 0.2 atm. The raw materials were epitaxially grown for 60 minutes under such conditions, thereby forming an epitaxial layer 3 consisting of GaN on the buffer layer 2.

Then, a luminescent layer 4 consisting of In$_{0.2}$Ga$_{0.8}$N was formed on the epitaxial layer 3 while maintaining the temperature of the substrate 1 at 800° C. by heating with the resistance heater 55, similarly to Example 1.

It has been confirmed that a blue light emitting device which was prepared in the aforementioned manner has high quality characteristics substantially similarly to the device according to Example 1.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An epitaxial wafer comprising:
    a volatile compound semiconductor substrate consisting of a compound semiconductor selected from the group consisting of GaAs, GaP, InAs and InP;
    a buffer layer consisting of InN formed on said substrate; and
    an epitaxial layer, containing a material selected from the group consisting of InGaN and GaN, formed on said buffer layer.

2. A compound semiconductor light emitting device comprising:
    a volatile compound semiconductor substrate;
    a buffer layer consisting of InN formed on said substrate;
    a relaxation layer substantially consisting of In$_x$Ga$_{1-x}$N formed on said buffer layer; and
    a luminescent layer substantially consisting of In$_k$Ga$_{1-k}$N formed on said relaxation layer;
    wherein k represents a constant value within the range of 0<k<1, and
    wherein x decreases from 1 to k, excluding 1 and k, through said relaxation layer in the direction of thickness from a side of said relaxation layer adjacent said buffer layer toward a side of said relaxation layer adjacent said luminescent layer.

3. The compound semiconductor light emitting device in accordance with claim 2, wherein said volatile compound semiconductor substrate consists of a compound semiconductor selected from the group consisting of GaAs, GaP, InAs and InP.

4. A method of fabricating an epitaxial wafer including: a volatile compound semiconductor substrate; a buffer layer consisting of InN formed on said substrate; and an epitaxial layer, containing a material selected from the group consisting of InGaN and GaN, formed on said buffer layer;
    said method comprising the steps of:
    setting said volatile compound semiconductor substrate into a reaction chamber;
    forming said buffer layer consisting of InN on said substrate by introducing a first gas containing a first organic metal raw material containing hydrogen chloride and indium and a second gas containing ammonia into said reaction chamber, while heating said reaction chamber overall from the exterior for carrying out vapor deposition from said first and second gases onto said substrate in said reaction chamber; and
    forming said epitaxial layer containing InGaN on said buffer layer by introducing a third gas containing a second organic metal raw material containing gallium and a third organic metal raw material containing indium and a fourth gas containing ammonia into said reaction chamber while heating said reaction chamber overall from the exterior for carrying out vapor deposition from said third and fourth gases onto said substrate in said reaction chamber.

5. The method of fabricating the epitaxial wafer in accordance with claim 4, wherein said volatile compound semiconductor substrate consists of a compound semiconductor selected from the group consisting of GaAs, GaP, InAs and InP.

6. The method of fabricating the epitaxial wafer in accordance with claim 4, wherein said second organic metal raw material containing gallium is a material selected from the group consisting of trimethyl gallium and triethyl gallium, and said third organic metal raw material containing indium is a material selected from the group consisting of trimethyl indium and triethyl indium.

7. A method of fabricating the compound semiconductor light emitting device of claim 3, comprising the steps of:
    setting said volatile compound semiconductor substrate into a reaction chamber;
    forming said buffer layer consisting of InN on said substrate by introducing a first gas containing a first organic metal raw material containing hydrogen chloride and indium and a second gas containing ammonia into said reaction chamber while heating said reaction chamber overall from the exterior for carrying out vapor deposition from said first and second gases onto said substrate in said reaction chamber;
    forming said relaxation layer on said buffer layer while increasing the temperature of said substrate by introducing a third gas containing a second organic metal raw material containing gallium and a third organic metal raw material containing indium and a fourth gas containing ammonia into said reaction chamber while heating said reaction chamber overall from the exterior for carrying out vapor deposition from said third and fourth gases onto said substrate in said reaction chamber; and
    forming said luminescent layer on said relaxation layer by introducing a fifth gas containing a fourth organic metal raw material containing hydrogen chloride and gallium and a fifth organic metal raw material containing indium and a sixth gas containing ammonia into said reaction chamber while heating said reaction chamber overall from the exterior for carrying out vapor deposition from said fifth and sixth gases onto said substrate in said reaction chamber,
    wherein k represents a constant value within the range of 0<k<1, and
    wherein x decreases from 1 to k, excluding 1 and k, through said relaxation layer in the direction of thickness from a side of said relaxation layer adjacent said buffer layer toward a side of said relaxation layer adjacent said luminescent layer.

8. The method of fabricating the compound semiconductor light emitting device in accordance with claim 7, wherein said volatile compound semiconductor substrate consists of a compound semiconductor selected from the group consisting of GaAs, GaP, InAs and InP.

9. The method of fabricating the compound semiconductor light emitting device in accordance with claim 8, wherein said second organic metal raw material containing gallium is a material selected from the group consisting of trimethyl gallium and triethyl gallium, and said third organic metal raw material containing indium is a material selected from the group consisting of trimethyl indium and triethyl indium.

10. The compound semiconductor light emitting device in accordance with claim 2, wherein x decreases monotonously from 1 to k through said relaxation layer.

11. The compound semiconductor light emitting device in accordance with claim 10, wherein x decreases linearly through said relaxation layer.

12. The compound semiconductor light emitting device in accordance with claim 10, wherein x decreases as a curved function through said relaxation layer.

13. The compound semiconductor light emitting device in accordance with claim 2, wherein x decreases stepwise from 1 to k through said relaxation layer.

14. The compound semiconductor light emitting device in accordance with claim 2, wherein $0<k<0.4$, said luminescent layer is not doped with an emission center, and said light emitting device is adapted to emit a violet band-end emission.

15. The compound semiconductor light emitting device in accordance with claim 2, wherein $0.4 \leq k<0.7$, said luminescent layer is not doped with an emission center, and said light emitting device is adapted to emit a blue band-end emission.

16. The compound semiconductor light emitting device in accordance with claim 2, wherein $0.7 \leq k<0.9$, said luminescent layer is not doped with an emission center, and said light emitting device is adapted to emit a green band-end emission.

17. The compound semiconductor light emitting device in accordance with claim 2, wherein $0.9 \leq k<1$, said luminescent layer is not doped with an emission center, and said light emitting device is adapted to emit a yellow band-end emission.

18. The compound semiconductor light emitting device in accordance with claim 2, further comprising a clad layer formed on said luminescent layer, a first electrode on said clad layer, and a second electrode on a back surface of said substrate.

19. The compound semiconductor light emitting device in accordance with claim 2, wherein said luminescent layer further contains Mg as a p-type dopant.

20. The compound semiconductor light emitting device in accordance with claim 2, wherein said luminescent layer consists of said $In_k Ga_{1-k} N$.

* * * * *

UNITED STATES PATENT AND TRADEMARK OFFICE
CERTIFICATE OF CORRECTION

PATENT NO. : 5,864,573  
DATED : January 26, 1999  
INVENTOR(S) : Miura, et. al.

Page 1 of 2

It is certified that error appears in the above-identified patent and that said Letters Patent is hereby corrected as shown below:

hereby corrected as shown below.

On the Title page, under [54], line 3, after "AND" replace "METHOD" by --METHODS--;

please replace the drawing Fig. 2 as follows:

FIG. 2

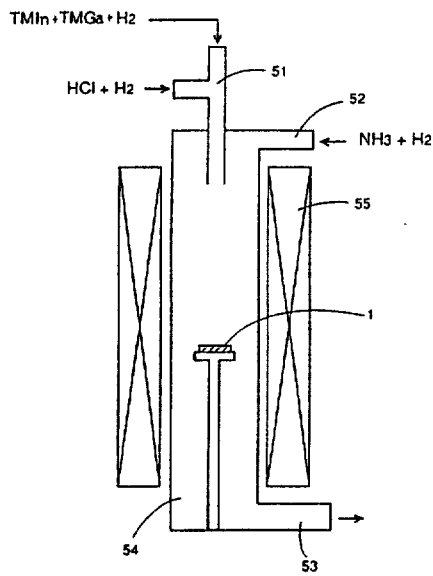

UNITED STATES PATENT AND TRADEMARK OFFICE
CERTIFICATE OF CORRECTION

PATENT NO. : 5,864,573
DATED : January 26, 1999
INVENTOR(S) : Miura, et. al.

It is certified that error appears in the above-identified patent and that said Letters Patent is hereby corrected as shown below:

Col. 1,   line 3,   after "AND" replace "METHOD" by --METHODS--;

Col. 2,   line 5,   after "and" (first occurrence) delete "that";
          line 40,  after "k" insert --through the relaxation layer--;

Col. 3,   line 42,  after "further" insert --preferably--;
          line 51,  after "further" replace "preferable" by --preferably--;

Col. 6,   line 4,   after "obtained" insert --,--;
          line 34,  after "lattice" delete "of";

Col. 8,   line 32,  after "claim" replace "3" by --2--;

Col. 9,   line 8,   after "claim" replace "8" by --7--.

Signed and Sealed this

Twenty-second Day of August, 2000

Attest:

Q. TODD DICKINSON

Attesting Officer       Director of Patents and Trademarks